United States Patent
Lee et al.

(10) Patent No.: US 12,537,543 B2
(45) Date of Patent: Jan. 27, 2026

(54) ERROR CORRECTION CODE (ECC) CIRCUIT INCLUDING LOW-DENSITY PARITY-CHECK DECODER IN ADAPTIVE OPERATION MODE, OPERATING METHOD OF THE ECC CIRCUIT, AND MEMORY CONTROLLER INCLUDING THE ECC CIRCUIT

(71) Applicant: SAMSUNG ELECTRONICS CO., LTD., Suwon-si (KR)

(72) Inventors: Kangseok Lee, Suwon-si (KR);
Bohwan Jun, Suwon-si (KR);
Youngjun Hwang, Suwon-si (KR);
Dongmin Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/643,302

(22) Filed: Apr. 23, 2024

(65) Prior Publication Data

US 2024/0356565 A1 Oct. 24, 2024

(30) Foreign Application Priority Data

Apr. 24, 2023 (KR) .......... 10-2023-0053389
Jul. 5, 2023 (KR) .......... 10-2023-0087407

(51) Int. Cl.
*H03M 13/00* (2006.01)
*H03M 13/11* (2006.01)
(Continued)

(52) U.S. Cl.
CPC ... *H03M 13/1174* (2013.01); *H03M 13/1575* (2013.01); *H03M 13/3746* (2013.01)

(58) Field of Classification Search
CPC ......... H03M 13/1174; H03M 13/1575; H03M 13/3746
See application file for complete search history.

(56) References Cited

U.S. PATENT DOCUMENTS 8,291,292 B1 10/2012 Varnica et al.
8,347,194 B2 1/2013 No et al.
(Continued)

FOREIGN PATENT DOCUMENTS

| CN | 102394113 | 6/2014 |
|---|---|---|
| CN | 114201335 | 3/2022 |
| EP | 3893399 | 10/2021 |

OTHER PUBLICATIONS

Declercq et al., "Finite Alphabet Iterative Decoders—Part II: Towards Guaranteed Error Correction of LDPC Codes via Iterative Decoder Diversity," IEEE Transactions on Communications, Oct. 2013, 61(10):4046-4057.

(Continued)

*Primary Examiner* — Esaw T Abraham
(74) *Attorney, Agent, or Firm* — Fish & Richardson P.C.

(57) ABSTRACT

An example operating method of an error correction code (ECC) circuit includes receiving a codeword from a memory device, calculating a syndrome vector based on the codeword and a parity-check matrix indicating whether messages are exchanged between check nodes and variable nodes, performing, when the syndrome vector is not a zero vector, sequential decoding on a plurality of columns of the parity-check matrix by decoding a first column in a first operation mode, the first column having a first variable node degree, decoding a second column in a second operation mode, the second column having a second variable node degree, and decoding a third column in a third operation mode, the third column having a third variable node degree, and calculating the syndrome vector whenever the sequential decoding of the plurality of columns is completed and iteratively performing the sequential decoding until the syndrome vector is the zero vector.

20 Claims, 15 Drawing Sheets

(51) Int. Cl.
   *H03M 13/15*   (2006.01)
   *H03M 13/37*   (2006.01)

(56) References Cited

U.S. PATENT DOCUMENTS

| | | | |
|---|---|---|---|
| 8,370,711 B2* | 2/2013 | Alrod | H03M 13/3738 |
| | | | 714/763 |
| 9,614,547 B2 | 4/2017 | Fainzilber et al. | |
| 10,790,859 B2* | 9/2020 | Kim | H03M 13/1142 |
| 11,074,128 B2* | 7/2021 | Bhatia | H03M 13/1117 |
| 11,444,638 B2 | 9/2022 | Asadi et al. | |
| 11,611,359 B2* | 3/2023 | Cho | G06F 3/0659 |
| 2013/0232389 A1 | 9/2013 | Varnica et al. | |
| 2015/0207523 A1 | 7/2015 | Abu-Surra et al. | |
| 2017/0366201 A1 | 12/2017 | Jain et al. | |

OTHER PUBLICATIONS

Extended European Search Report in European Appln. No. 24167744.2, mailed on Aug. 9, 2024, 11 pages.

* cited by examiner

FIG. 6A

| ERROR LEVEL \ NODE DEGREE | HIGH | LOW |
|---|---|---|
| HIGH | THIRD OPERATION MODE | THIRD OPERATION MODE |
| MIDDLE | SECOND OPERATION MODE | SECOND OPERATION MODE |
| LOW | FIRST OPERATION MODE | FIRST OPERATION MODE |

FIRST OPERATION MODE= Ultra-Low Power Mode

SECOND OPERATION MODE=Low Power Mode

THIRD OPERATION MODE=Normal Power Mode

FIG. 6B

| NODE DEGREE / ERROR LEVEL | HIGH | LOW |
|---|---|---|
| HIGH | THIRD OPERATION MODE | THIRD OPERATION MODE |
| MIDDLE | SECOND OPERATION MODE | SECOND OPERATION MODE |
| LOW | FIRST OPERATION MODE | SECOND OPERATION MODE |

FIRST OPERATION MODE= Ultra-Low Power Mode

SECOND OPERATION MODE=Low Power Mode

THIRD OPERATION MODE=Normal Power Mode

FIG. 6C

| NODE DEGREE / ERROR LEVEL | HIGH | LOW |
|---|---|---|
| HIGH | SECOND OPERATION MODE | THIRD OPERATION MODE |
| MIDDLE | FIRST OPERATION MODE | THIRD OPERATION MODE |
| LOW | FIRST OPERATION MODE | SECOND OPERATION MODE |

FIRST OPERATION MODE= Ultra-Low Power Mode

SECOND OPERATION MODE=Low Power Mode

THIRD OPERATION MODE=Normal Power Mode

FIG. 6D

| NODE DEGREE / ERROR LEVEL | HIGH | MIDDLE | LOW |
|---|---|---|---|
| HIGH | SECOND OPERATION MODE | THIRD OPERATION MODE | THIRD OPERATION MODE |
| MIDDLE | FIRST OPERATION MODE | SECOND OPERATION MODE | THIRD OPERATION MODE |
| LOW | FIRST OPERATION MODE | FIRST OPERATION MODE | SECOND OPERATION MODE |

FIRST OPERATION MODE= Ultra-Low Power Mode

SECOND OPERATION MODE=Low Power Mode

THIRD OPERATION MODE=Normal Power Mode

ERROR CORRECTION CODE (ECC) CIRCUIT INCLUDING LOW-DENSITY PARITY-CHECK DECODER IN ADAPTIVE OPERATION MODE, OPERATING METHOD OF THE ECC CIRCUIT, AND MEMORY CONTROLLER INCLUDING THE ECC CIRCUIT

CROSS-REFERENCE TO RELATED APPLICATIONS

This application claims priority under 35 U.S.C. § 119 to Korean Patent Application Nos. 10-2023-0053389, filed on Apr. 24, 2023 and 10-2023-0087407, filed on Jul. 5, 2023, in the Korean Intellectual Property Office, the disclosures of which are incorporated by reference herein in their entireties.

BACKGROUND

When data is stored in a storage device, encoded data for error detection and correction may also be stored in the storage device. When data is read from the storage device, ECC decoding may be performed on encoded data.

ECC decoding may be repeatedly performed in a plurality of stages. When ECC decoding fails in one stage, it is necessary to increase the reliability and correction capability of ECC decoding in a subsequent stage.

SUMMARY

The present disclosure relates to error correction code (ECC) circuits including a low-density parity-check (LDPC) decoder capable of reducing power consumption by variably setting an operation mode for decoding each column when columns sequentially undergo LDPC decoding, memory controllers including the ECC circuits, and operating methods of the ECC circuits.

In some implementations, an operating method of an ECC circuit includes receiving a codeword from a memory device, calculating a syndrome vector based on the codeword and a parity-check matrix including information indicating whether messages are exchanged between a plurality of check nodes and a plurality of variable nodes, performing, when the syndrome vector is not a zero vector, sequential decoding on a plurality of columns of the parity-check matrix by decoding a first column in a first operation mode, the first column having a first variable node degree among the plurality of columns, decoding a second column in a second operation mode, the second column having a second variable node degree among the plurality of columns, and decoding a third column in a third operation mode, the third column having a third variable node degree among the plurality of columns, and calculating the syndrome vector whenever the sequential decoding of the plurality of columns is completed and iteratively performing the sequential decoding until the syndrome vector is the zero vector.

In some implementations, an ECC circuit includes an LDPC encoder configured to encode write data received from a host and an LDPC decoder configured to decode read data received from a memory device, wherein the LDPC decoder is further configured to receive a codeword corresponding to the read data from the memory device, calculate a syndrome vector based on the codeword and a parity-check matrix including information indicating whether messages are exchanged between a plurality of check nodes and a plurality of variable nodes, perform sequential decoding on a plurality of columns of the parity-check matrix, when the syndrome vector is not a zero vector, by decoding a first column in a first operation mode, decoding a second column in a second operation mode, and decoding a third column in a third operation mode, calculate the syndrome vector whenever the sequential decoding of the plurality of columns is completed, and iteratively perform the sequential decoding until the syndrome vector is the zero vector.

In some implementations, an operating method of an ECC circuit includes receiving a codeword from a memory device, obtaining an error metric with respect to each of a plurality of columns of a parity-check matrix by performing a first decoding iteration on the codeword, determining one of a first operation mode, a second operation mode, and a third operation mode to be an operation mode for each of the plurality of columns, based on the error metric obtained in the first decoding iteration and a variable node degree of each of the plurality of columns, and performing a second decoding iteration according to the operation mode determined for each of the plurality of columns.

BRIEF DESCRIPTION OF THE DRAWINGS

Implementations will be more clearly understood from the following detailed description, taken in conjunction with the accompanying drawings.

FIG. 6A illustrates an example of a table for determining an operation mode, according to an implementation.

FIG. 6B illustrates another example of a table for determining an operation mode, according to an implementation.

FIG. 6C illustrates still another example of a table for determining an operation mode, according to an implementation.

FIG. 6D illustrates a further example of a table for determining an operation mode, according to an implementation.

DETAILED DESCRIPTION

Hereinafter, implementations are described in detail with reference to the accompanying drawings.

Figure 1:
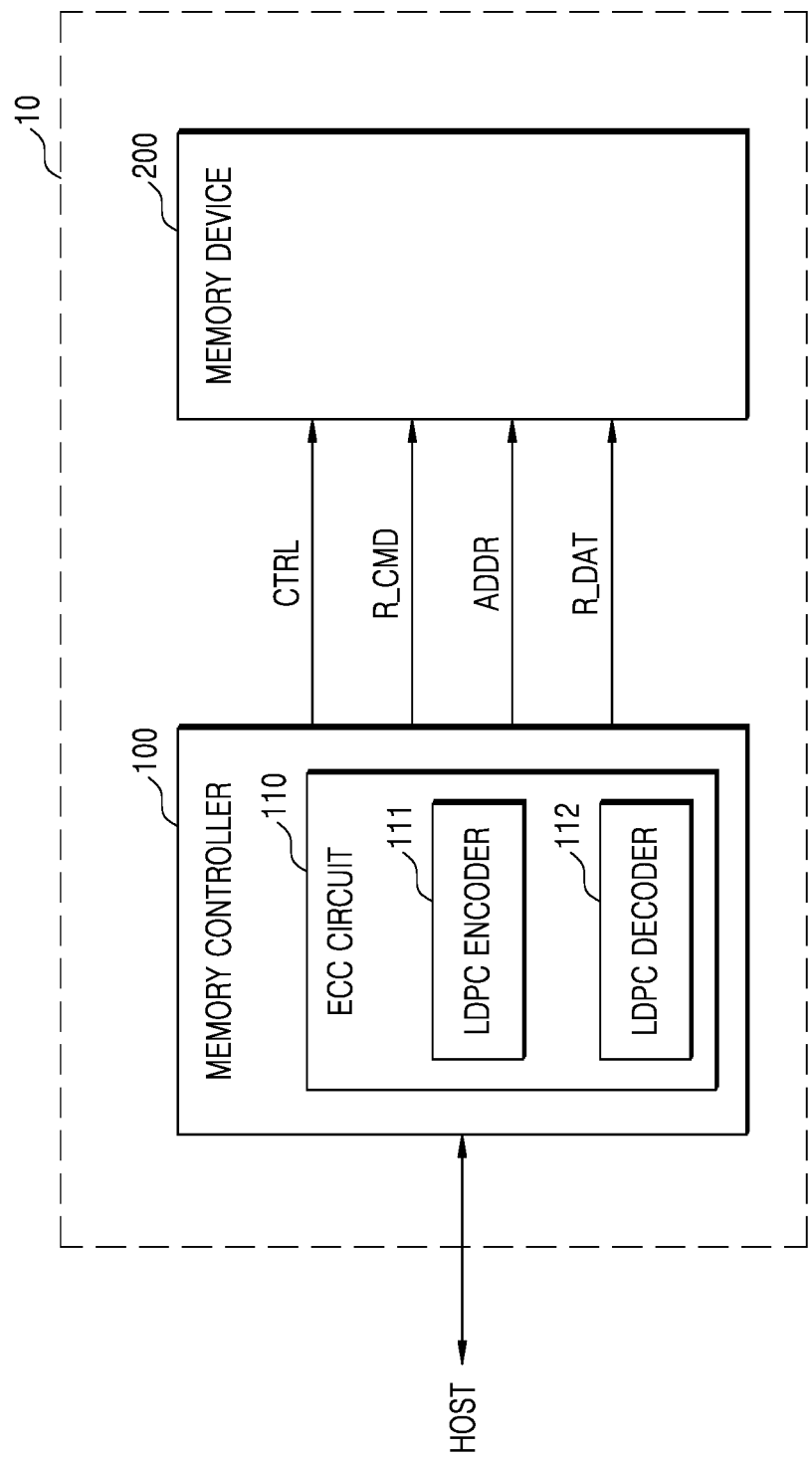
FIG. 1 is a block diagram of a storage device according to an implementation.

FIG. 1 is a block diagram of a storage device 10 according to an implementation.

Referring to FIG. 1, the storage device 10 includes a memory controller 100 and a memory device 200.

The memory controller 100 may control the memory device 200 to read data therefrom or write data thereto in response to a read or write request received from a host. In detail, the memory controller 100 may control program (or write), read, and erase operations of the memory device 200 by providing an address ADDR, a command (e.g., R_CMD), and a control signal CTRL to the memory device 200. Data to be written and read data (e.g., R_DAT) may be exchanged between the memory controller 100 and the memory device 200.

The memory device 200 may include various kinds of memory, e.g., dynamic random access memory (DRAM), such as double data rate (DDR) synchronous DRAM (SDRAM), low power DDR (LPDDR) SDRAM, graphics DDR (GDDR) SDRAM, or Rambus DRAM (RDRAM). However, implementations are not limited thereto. The memory device 200 may include non-volatile memory, such as flash memory, magnetic RAM (MRAM), ferroelectric RAM (FeRAM), phase-change RAM (PRAM), or resistive RAM (ReRAM).

The memory device 200 may include a memory cell array, a write/read circuit, and a control logic. When the memory device 200 corresponds to a resistive memory device, the memory cell array may include resistive memory cells.

Figure 2:
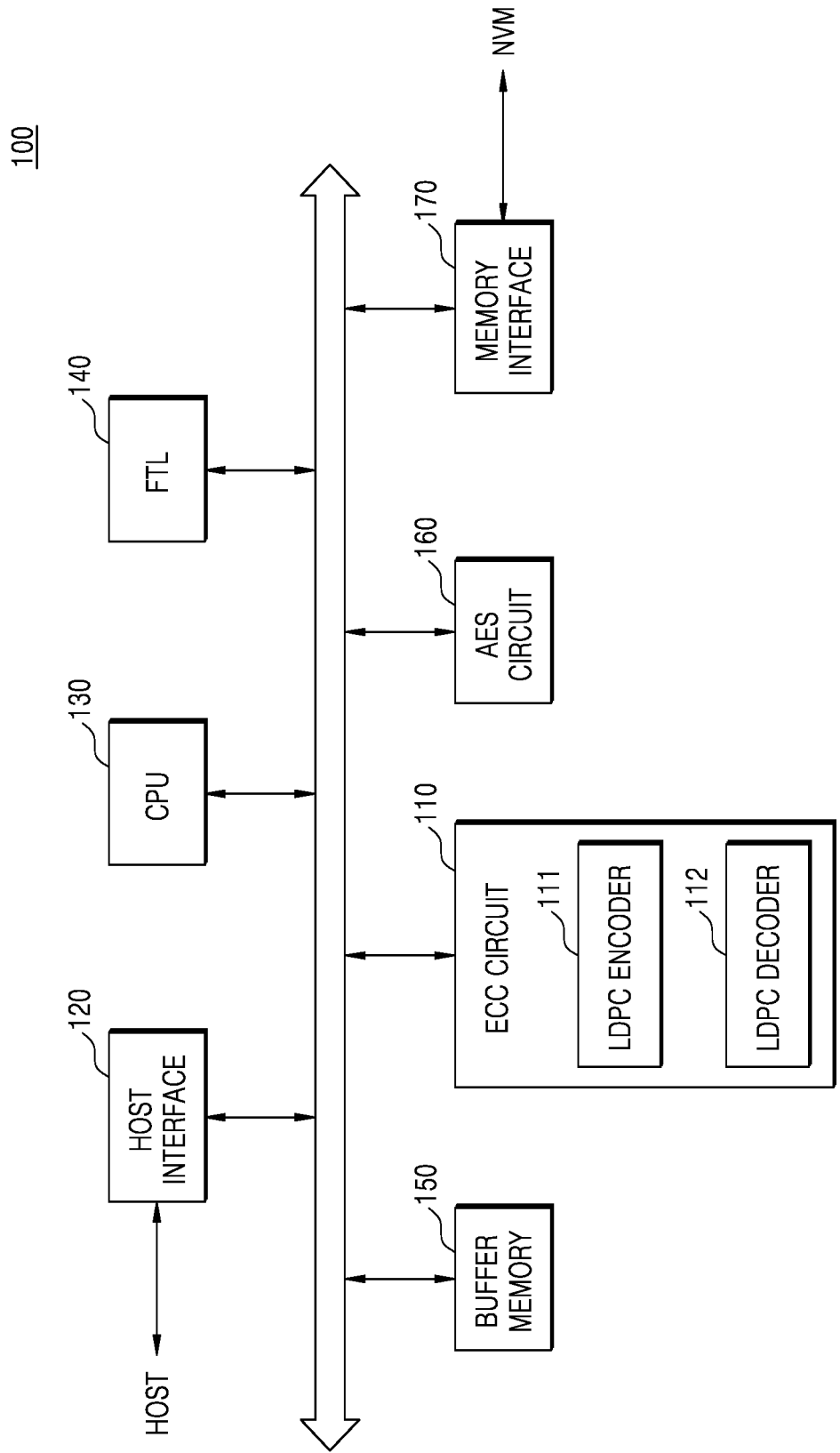
FIG. 2 is a block diagram of a memory controller according to an implementation.

The memory controller 100 may include a host interface (e.g., 120 in FIG. 2). The storage device 10 may communicate with the host through the host interface.

The memory controller 100 may include an error correction code (ECC) circuit 110, which performs error correction on the read data R_DAT read from the memory device 200, and may provide error-corrected read data to the host.

In some implementations, the ECC circuit 110 may include a low-density parity-check (LDPC) encoder 111 and an LDPC decoder 112. The LDPC encoder 111 may perform ECC encoding on data requested to be written to the memory device 200. At this time, the ECC encoding may be based on an LDPC code. The LDPC decoder 112 may perform ECC decoding on the read data R_DAT. The ECC decoding may also be based on an LDPC code.

In some implementations, the LDPC decoder 112 may set an operation mode for each column. For example, the LDPC decoder 112 may perform column decoding in one operation low-power decoding, and a third operation mode for normal decoding. Operation modes for each column are described in detail below.

FIG. 2 is a block diagram of the memory controller 100 according to an implementation.

Referring to FIGS. 1 and 2, the memory controller 100 includes a host interface 120, a central processing unit (CPU) 130, a flash translation layer (FTL) 140, a buffer memory 150, the ECC circuit 110, an advanced encryption standard (AES) circuit 160, and a memory interface 170.

The memory controller 100 may further include a packet manager and a working memory, to which the FTL 140 is loaded. Data write and read operations of non-volatile memory (NVM) may be controlled by executing the FTL 140 by using the CPU 130.

The host interface 120 may exchange packets with a host. A packet transmitted from the host to the host interface 120 may include a command or data to be written to the NVM. A packet transmitted from the host interface 120 to the host may include a response to a command or data read from the NVM. In some implementations, the host interface 120 may transmit decoded data of the ECC circuit 110 to the host.

The memory interface 170 may transmit data to be written to the NVM or receive data read from the NVM. The memory interface 170 may be implemented to comply with a standard, such as Toggle or open NAND flash interface (ONFI).

The FTL 140 may perform various functions, such as address mapping, wear-leveling, and garbage collection. Address mapping is an operation of converting a logical address received from the host into a physical address, which is actually used to store data in the NVM. Wear-leveling is technology for preventing excessive degradation of a block by allowing blocks of the NVM to be uniformly used. For example, the wear-leveling may be implemented as a firmware technique for balancing the erase counts of physical blocks. Garbage collection is technology for securing the available capacity of the NVM by copying valid data of an old block to a new block and erasing the old block.

The buffer memory 150 may temporarily store data to be written to the NVM or data read from the NVM. The buffer memory 150 may be inside or outside the memory controller 100.

In some implementations, the buffer memory 150 may store decoded data, which is generated as a result of ECC decoding repeatedly performed by the ECC circuit 110. The buffer memory 150 may also temporarily store decoded data resulting from successful decoding by the ECC circuit 110. Although it is illustrated in FIG. 2 that the buffer memory 150 is outside the ECC circuit 110, the buffer memory 150 may be included in the ECC circuit 110.

The ECC circuit 110 may perform error detection and correction on read data that is read from the NVM. In detail, the ECC circuit 110 may generate parity bits with respect to write data that is to be written to the NVM. The parity bits may be stored in the NVM together with the write data. During a read operation of the NVM, the ECC circuit 110 may correct an error in read data by using parity bits, which are read from the NVM together with the read data, and may output error-corrected read data.

The LDPC decoder 112 may perform iterative decoding on read data. For example, first iterative decoding of the LDPC decoder 112 may include at least one decoding operation. A parameter value used for a decoding operation may be changed for each decoding operation included in the first iterative decoding. Herein, performing of each decoding operation included in iterative decoding may be referred to as performing an iteration.

The LDPC decoder 112 may correct error bits in read data by iteratively performing decoding operations.

The LDPC decoder 112 may generate decoded data as a result of each iteration while performing iterative decoding on read data. The LDPC decoder 112 may determine decoding success or failure, based on decoded data generated in each iteration. When decoding is successful or when conditions for terminating iterative decoding are satisfied, the LDPC decoder 112 may terminate the iterative decoding. The conditions for terminating iterative decoding may be preset. For example, when the number of iterations reaches a maximum iteration count, iterative decoding may be terminated.

The LDPC decoder 112 may store, as intermediate data, at least one piece of decoded data among a plurality of pieces of decoded data generated during iterative decoding. The decoded data stored as the intermediate data may be the closest to successful decoding among the pieces of decoded data. For example, data close to successful decoding may refer to data having a low error rate, from among a plurality of pieces of decoded data. Various criteria may be used to calculate an error rate with respect to decoded data. For example, the syndrome or checksum of decoded data may be used.

When the syndrome of decoded data is used, the LDPC decoder 112 may generate a syndrome vector by multiplying the decoded data by a parity-check matrix and may identify the number of 0s or 1s in the syndrome vector. For example, the more 0s the syndrome vector includes, the closer the decoded data may be determined to be to successful decoding.

The LDPC decoder 112 may calculate the syndrome of the first decoded data generated during one decoding iteration. The first decoded data may be stored in the buffer memory 150 or a separate buffer of the ECC circuit 110. The LDPC decoder 112 may perform another decoding iteration, calculate the syndrome of second decoded data generated as a result of the decoding iteration, and compare the syndrome of the first decoded data with the syndrome of the second decoded data.

As described above, the LDPC decoder 112 may determine a syndrome vector including more 0s from among the syndrome vector of the first decoded data and the syndrome vector of the second decoded data. Based on a result of the determination, the LDPC decoder 112 may perform another iteration or update intermediate data stored therein with the second decoded data.

When the ECC circuit 110 includes a plurality of LDPC decoders 112, the LDPC decoders 112 may sequentially perform ECC decoding. For example, when decoding of a first LDPC decoder fails, a second LDPC decoder may perform decoding. Each of the first and second LDPC decoders may perform iterative decoding until conditions for terminating iterative decoding are satisfied.

The AES circuit 160 may perform at least one of encryption and decryption of data, which is input to the memory controller 100, by using a symmetric-key algorithm.

Figure 3A:
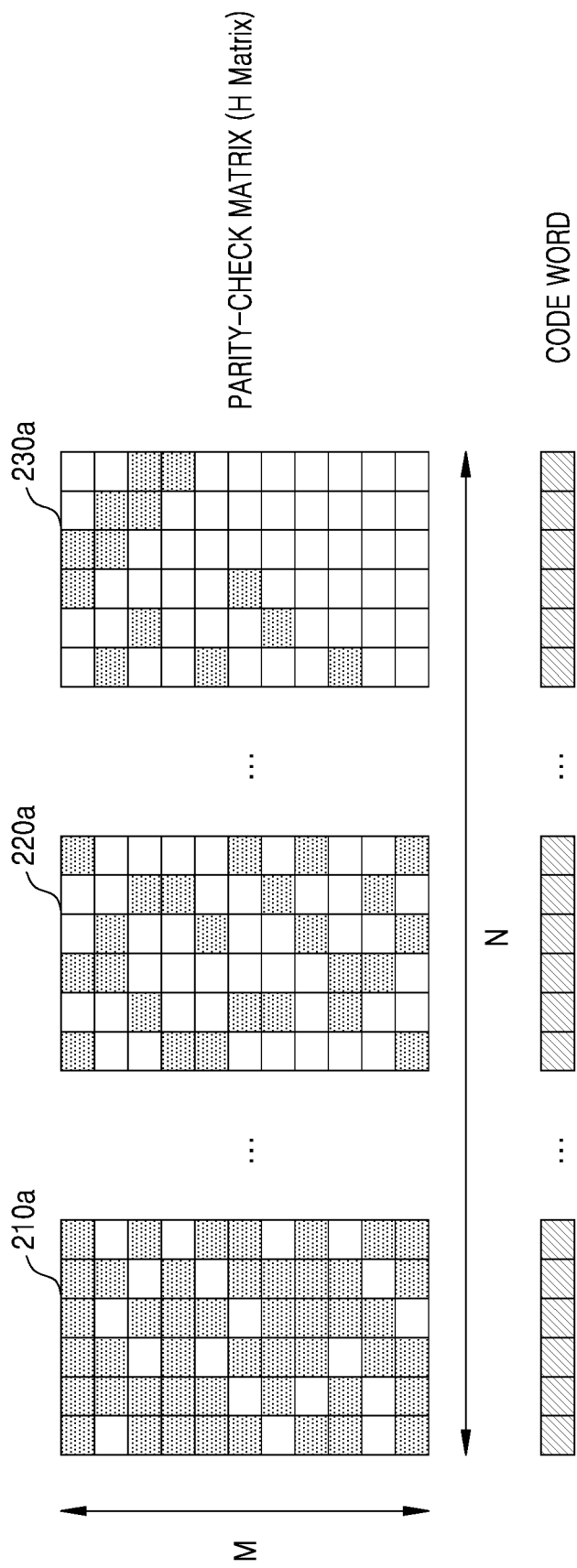
FIG. 3A illustrates an example of a parity-check matrix according to an implementation.

FIG. 3A illustrates an example of a parity-check matrix 200a according to an implementation.

Referring to FIG. 3A, the parity-check matrix 200a corresponds to a parity-check matrix of an LDPC code. The parity-check matrix 200a may be used when the LDPC encoder 111 generates a codeword or when the LDPC decoder 112 determines whether a codeword is correct. For example, the LDPC encoder 111 may generate a codeword by performing matrix multiplication on a G matrix and a binary message. The LDPC decoder 112 may obtain a syndrome vector by performing matrix multiplication on the parity-check matrix 200a and a codeword, which is read from memory (e.g., the memory device 200 in FIG. 1). When the syndrome vector is 0, the read codeword may be determined to be a correct codeword (e.g., a codeword without an error bit). When the syndrome vector is not 0, the LDPC decoder 112 may determine that there is an error in the read codeword and may correct the error by performing iterative decoding.

In some implementations, the size of the parity-check matrix 200a may be M□N. In other words, the parity-check matrix 200a may include M rows and N columns. Each of the M rows may correspond to a check node and each of the N columns may correspond to a variable node. The number of columns may correspond to the length of a codeword. For example, when there are N columns, the length of a codeword may be N.

In some implementations, the parity-check matrix 200a may correspond to a parity-check matrix of irregular LDPC. For example, the number of 1s may be different among the M rows or the N columns of the parity-check matrix 200a.

The parity-check matrix 200a may be classified into a first area 210a, a second area 220a, and a third area 230a. The first to third areas 210a, 220a, and 230a may have respectively different column degrees. Here, a column degree may indicate the number of 1s among the components of an M□1 column and may be referred to as a variable node degree. For example, the column degree of the first area 210a may be high (e.g., 8) and the respective column degrees of the second area 220a and the third area 230a may be low (e.g., 2 to 3). Whether the column degree is high or low may be determined according to a threshold value. For example, the case in which the parity-check matrix 200a has M rows and the column degree is greater than or equal to M/2 may be classified as the first area 210a having a high column degree. The case in which the parity-check matrix 200a has M rows and the column degree is less than M/2 may be classified as the second area 220a or the third area 230a, having a low column degree.

Referring to FIG. 3A, the parity-check matrix 200a may be configured such that the column degree decreases as a column count sequentially increases. In other words, it may be seen that the first column of the parity-check matrix 200a has a column degree of 8 and the last column of the parity-check matrix 200a has a column degree of 2.

Although the parity-check matrix 200a of FIG. 3A is configured such that a column degree decreases as a column count sequentially increases, implementations are not limited thereto. In some implementations, referring to FIG. 3B, a parity-check matrix 200b may be configured such that a column degree increases as a column count sequentially increases. In other words, in the parity-check matrix 200b of FIG. 3B, a first area 210b and a second area 220b may correspond to a low column degree and a third area 230b may correspond to a high column degree.

Figure 4:
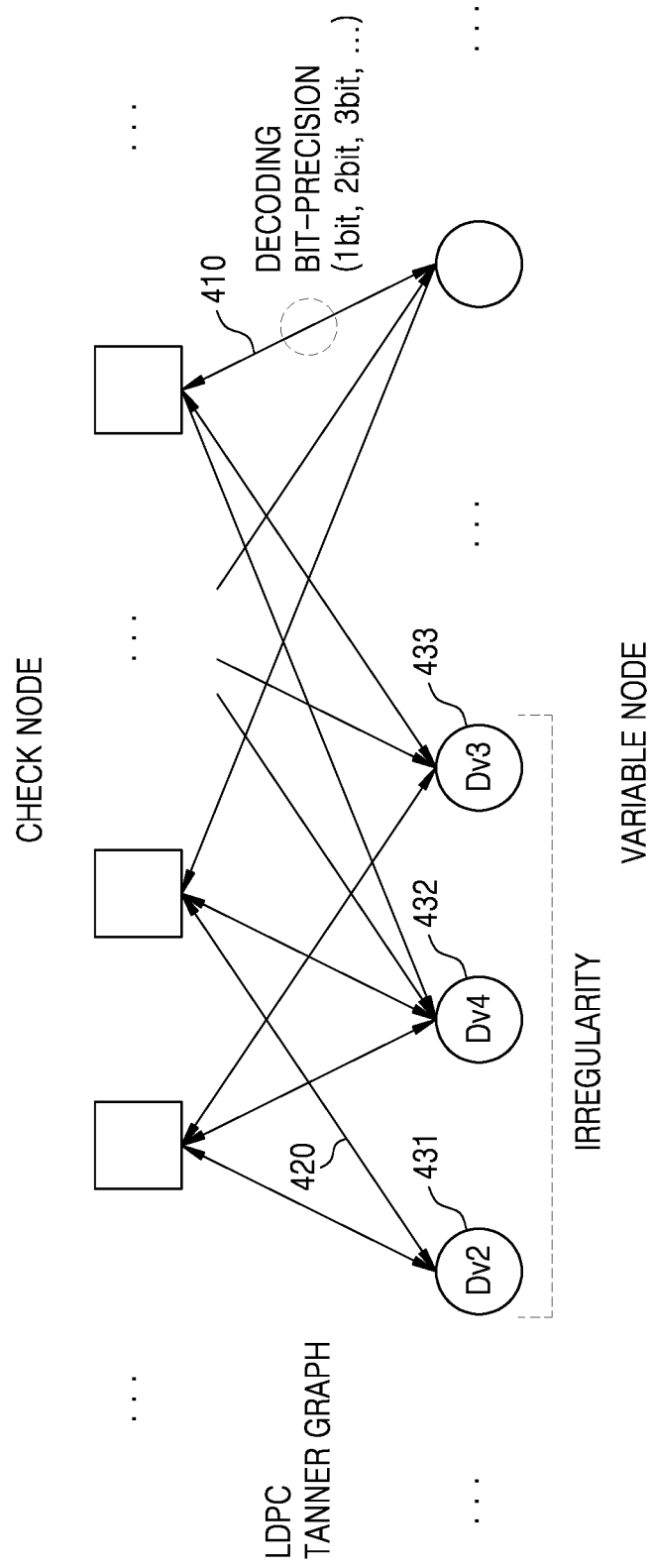
FIG. 4 illustrates an example of a tanner graph corresponding to a parity-check matrix of a low-density parity-check (LDPC) code, according to an implementation.

FIG. 4 illustrates an example of a tanner graph corresponding to a parity-check matrix of an LDPC code according to an implementation.

FIG. 4 illustrates a tanner graph corresponding to a parity-check matrix. Decoding of an LDPC code may be carried out by message exchange on the tanner graph. The check node of the tanner graph may correspond to a row of the parity-check matrix and the variable node of the tanner graph may correspond to a column of the parity-check matrix. The tanner graph may show the connection between a check node and a variable node. For example, an element in the first row and the first column of the parity-check matrix H (e.g., parity-check matrix (H Matrix) in FIG. 3B) may indicate whether message exchange is performed between a first check node $C_1$ and a first variable node $V_1$ of the tanner graph. At this time, in the parity-check matrix H, an element having a value of 1 may indicate that message exchange is performed between a check node and a variable node, and an element having a value of 0 may indicate that message exchange is not performed between a check node and a variable node.

An edge connecting a check node to a variable node on the tanner graph of the parity-check matrix may represent message exchange between the check node and the variable node. In other words, an edge may correspond to a non-zero component of the parity-check matrix. An edge 410 may correspond to message information provided by a variable node to a check node. An edge 420 may correspond to check information provided by a check node to a variable node. The check information of a check node may indicate whether the sum of pieces of message information received from at least one variable node connected to the check node is 0 or another value. Here, when the sum of pieces of information received by the check node is 0, a codeword corresponding to a current column may be correct. Otherwise, when the sum of pieces of information received by the check node is not 0, a codeword corresponding to a current column may include an error.

A first variable node 431 may receive check information from two check nodes. A second variable node 432 may receive check information from four check nodes. A third variable node 433 may receive check information from three check nodes. In other words, in some implementations, it may be seen that the parity-check matrix corresponds to an irregular LDPC code and the variable nodes 431, 432 and 433 respectively receive different numbers of pieces of check information.

In some implementations, the LDPC decoder 112 may set an operation mode for each column. For example, the LDPC decoder 112 may perform column decoding in one operation low-power decoding, and a third operation mode for normal decoding. For example, when column decoding is performed in the first operation mode for ultra-low-power decoding, the LDPC decoder 112 may set the size of a message transmitted between a check node and a variable node to 1 bit. In other words, bit-precision may be 1. When column decoding is performed in the second operation mode for low-power decoding, the LDPC decoder 112 may set the size of a message transmitted between a check node and a variable node to 2 bits. In other words, bit-precision may be 2. When column decoding is performed in the third operation mode for normal decoding, the LDPC decoder 112 may set the size of a message transmitted between a check node and a variable node to 3 bits. In other words, bit-precision may be 3. The smaller the size of a message is set, the less components, such as registers, which temporarily store information included in the message, are needed, and accordingly, power consumed for decoding may be reduced.

Here, a row of the parity-check matrix may correspond to a check node and a column of the parity-check matrix may correspond to a variable node.

Figure 5:
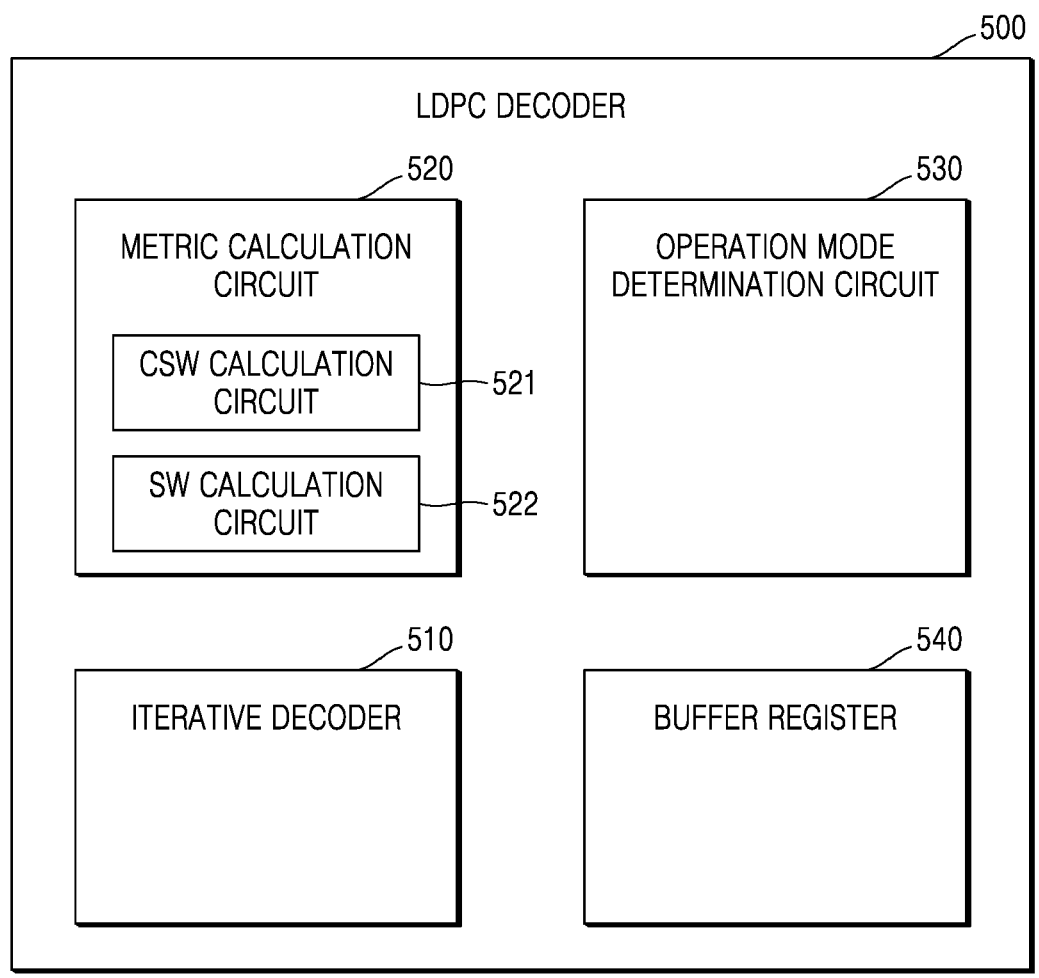
FIG. 5 is a block diagram of an LDPC decoder according to an implementation.

FIG. 5 is a block diagram of an LDPC decoder 500 according to an implementation.

Referring to FIG. 5, the LDPC decoder 500 includes an iterative decoder 510, a metric calculation circuit 520, an operation mode determination circuit 530, and a buffer register 540.

The iterative decoder 510 may perform LDPC decoding. For example, the iterative decoder 510 may iteratively perform an operation of column decoding sequentially from the first to N-th columns of a parity-check matrix. The iterative decoder 510 may iteratively perform the sequential column decoding until a syndrome vector resulting from matrix multiplication between the parity-check matrix and a codeword is a zero vector.

The metric calculation circuit 520 may calculate metrics for determining the error level of a codeword. The metrics for determining the error level of a codeword may include a checksum weight (CSW) and a syndrome weight (SW). In detail, the metric calculation circuit 520 may include a CSW calculation circuit 521 and an SW calculation circuit 522. The CSW calculation circuit 521 may calculate the number of check nodes that succeed in decoding whenever performing column decoding during sequential column decoding. For example, when the sum of message information received from variable nodes connected to each check node is 0, the check node may output information indicating that a current codeword is correct. In other words, the CSW calculation circuit 521 may calculate the number of check nodes that output non-zero check information. Whenever column decoding is performed, the SW calculation circuit 522 may calculate a syndrome vector by performing matrix multiplication on the parity-check matrix and a codeword undergoing sequential column decoding and calculate the number of 1s among the matrix elements of the syndrome vector. The value of the CSW and the SW may increase when the number of errors in a codeword increases.

The operation mode determination circuit 530 may determine an operation mode for each column. For example, the operation mode determination circuit 530 may determine such that the first column of the parity-check matrix is decoded in the first operation mode for ultra-low-power decoding, the second column of the parity-check matrix is decoded in the second operation mode for low-power decoding, and the third column of the parity-check matrix is decoded in the third operation mode for normal decoding. In detail, the operation mode determination circuit 530 may determine an operation mode, based on the column degree (or variable node degree) and error level (e.g., CSW and SW) of each column. For example, when the error level of a codeword, which corresponds to a column having a high column degree and thus having a high error correction capability, is low, the operation mode determination circuit 530 may determine that the column is decoded in the first operation mode. Because of the low error level in addition to the high error correction capability, even when the size of a message transmitted between a variable node and a check node is just 1 bit, it is sufficient to perform error correction. For example, when the error level of a codeword, which corresponds to a column having a low column degree and thus having a degraded error correction capability, is high, the operation mode determination circuit 530 may determine that the column is decoded in the third operation mode. Because of the high error level in addition to a relatively low error correction capability, error correction may fail when the size of a message transmitted between a variable node and a check node is set to 1 bit or 2 bits, and therefore, it is necessary to set the size of a message to 3 bits.

The buffer register 540 may temporarily store the information of a message transmitted between a variable node and a check node. For example, when column decoding is performed in the first operation mode, the buffer register 540 needs to store just 1 bit, and accordingly, power consumption may be relatively low. For example, when column decoding is performed in the third operation mode, the buffer register 540 needs to store 3 bits, and accordingly, power consumption may be relatively high.

In some implementations, the buffer register 540 may further store an operation mode for each column according to an iteration mode. The iteration mode may vary with a method of determining an operation mode for each column. For example, a first iteration mode may refer to a mode, in which an operation mode for an (N+1)-th column is determined based on the column degree of an N-th column and the error level of a codeword corresponding to the N-th column. A second iteration mode may refer to a mode, in which an operation mode for the N-th column is determined based on the column degree of the N-th column and the error level of a codeword corresponding to the N-th column.

In some implementations, when the LDPC decoder 500 operates in the first iteration mode, the buffer register 540 may temporarily store the operation mode for the (N+1)-th column until the (N+1)-th column is completely decoded after decoding of the N-th column. When the LDPC decoder 500 operates in the second iteration mode, the buffer register 540 may temporarily store operation modes, which are respectively determined for N columns during one iteration, until a subsequent iteration is completely performed. The first iteration mode and the second iteration mode are described below with reference to FIGS. 8 and 9, respectively.

FIGS. 6A to 6D illustrate examples of tables for determining an operation mode according to some implementations.

Referring to FIG. 6A, the operation mode determination circuit 530 may determine an operation mode for a column, based on the error level and column degree of the column. In detail, according to the table of FIG. 6A, the operation mode determination circuit 530 may apply a higher weight to the error level of a column than to the column degree of the column. For example, when the error level of a column is "high", the operation mode determination circuit 530 may determine that the column is always decoded in the third operation mode regardless of the column degree of the column, in order to maximize an error correction capability. Accordingly, when the error level is "high", the size of a message transmitted between a check node and a variable node may be 3 bits. For example, when the error level of a column is "low", the operation mode determination circuit 530 may determine that the column is always decoded in the first operation mode regardless of the column degree of the column, in order to maximize power optimization. Accordingly, when the error level is "low", the size of a message transmitted between a check node and a variable node may be 1 bit. For example, when the error level of a column is "middle", the operation mode determination circuit 530 may determine that the column is always decoded in the second operation mode regardless of the column degree of the column, in order to balance error correction and power optimization. Accordingly, when the error level is "middle", the size of a message transmitted between a check node and a variable node may be 2 bits.

Referring to FIG. 6B, the operation mode determination circuit 530 may determine that a column is decoded in the first operation mode only when the error level of the column is "low" and the column degree of the column is high. Like FIG. 6A, when the error level of a column is "high", the operation mode determination circuit 530 may determine that the column is always decoded in the third operation mode regardless of the column degree of the column, in order to increase an error correction capability. Differently from FIG. 6A, according to the table of FIG. 6B, the operation mode determination circuit 530 may determine that a column is decoded in the second operation mode when the column degree of the column is low even though the error level of the column is "low". Because the column has a low column degree and thus has a relatively low error correction capability even when the error level of the column is low, the number of decoding iterations may increase if the size of a message is set to 1 bit. Accordingly, even though the error level of the column is low, the column may be determined to be decoded in the second operation mode when the column degree of the column is low.

Referring to FIG. 6C, the operation mode determination circuit 530 may determine an operation mode, based on the error level and column degree of a column. In detail, referring to the table of FIG. 6C, the operation mode determination circuit 530 may apply a higher weight to the column degree of a column than to the error level of the column. For example, when the column degree is high, the operation mode determination circuit 530 may basically determine the first operation mode. When the column degree is low, the third operation mode may be determined.

However, even when the column degree of a column is high, the operation mode determination circuit 530 may exceptionally determine that the column is decoded in the second operation mode rather than the first operation mode, in order to increase an error correction capability. Even when the column degree of a column is low, the operation mode determination circuit 530 may exceptionally determine that the column is decoded in the second operation mode rather than the third operation mode, in order to decrease power consumption.

Referring to FIG. 6D, the operation mode determination circuit 530 may further subdivide a column degree into three categories when determining an operation mode. For example, the column degree may be subdivided into three categories, "high", "middle", and "low", rather than two categories of "high" and "low". When the column degree of a column is the same as the error level of the column, the operation mode determination circuit 530 may determine the second operation mode for the column to balance an error correction capability and power consumption optimization. For example, when the error level of a column is higher than the column degree of the column, the operation mode determination circuit 530 may determine the third operation mode for the column. When the error level of a column is "high" and the column degree of the column is low or middle or when the error level of a column is "middle" and the column degree of the column is low, column decoding may be performed in the third operation mode. For example, when the error level of a column is lower than the column degree of the column, the operation mode determination circuit 530 may determine the first operation mode for the column. When the error level of a column is "low" and the column degree of the column is high or middle or when the error level of a column is "middle" and the column degree of the column is high, column decoding may be performed in the first operation mode.

Referring to FIGS. 6A to 6D, the operation mode determination circuit 530 may determine an operation mode, based on an error level and a column degree. However, criteria based on which the operation mode determination circuit 530 determines an operation mode are not limited to those described above. The operation mode determination circuit 530 may determine an operation mode, further based on other various criteria.

Figure 7:
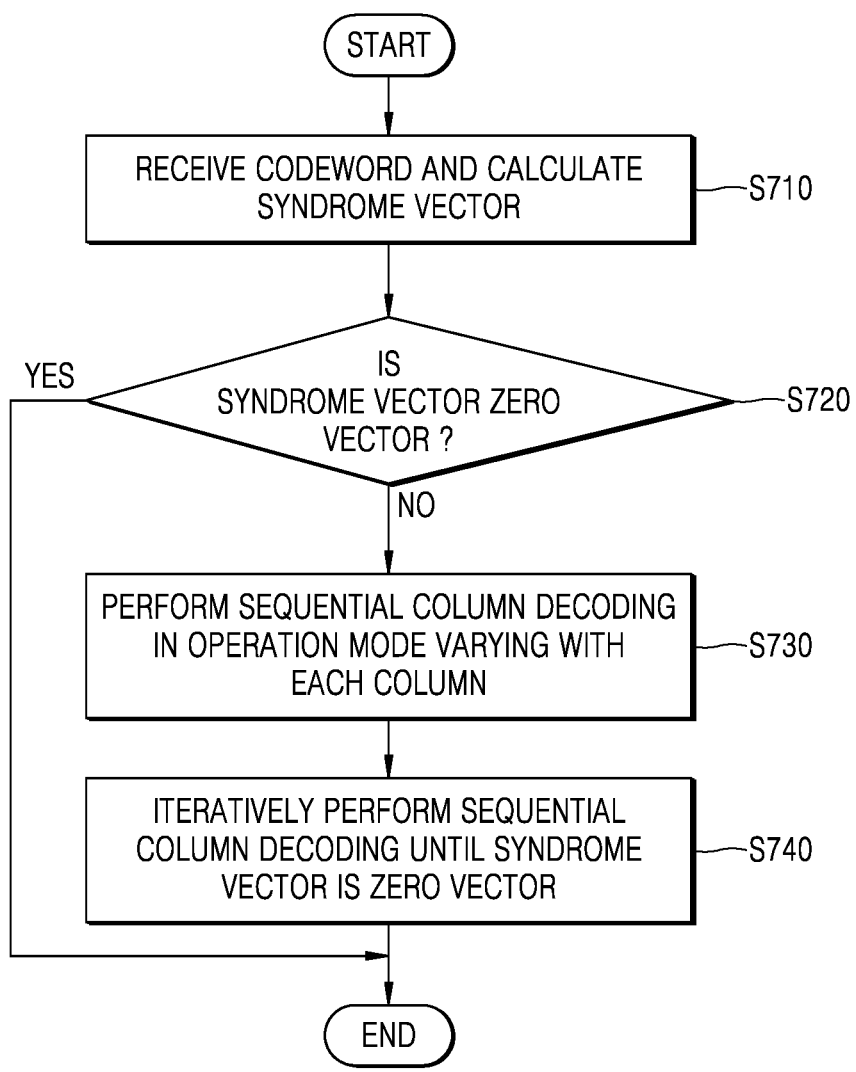
FIG. 7 is a flowchart of an operating method of an LDPC decoder, according to an implementation.

FIG. 7 is a flowchart of an operating method of the LDPC decoder 112 according to an implementation.

Referring to FIG. 7, the LDPC decoder 112 receives a codeword and calculate a syndrome vector in operation S710. The codeword may correspond to data read from memory (e.g., the memory device 200 in FIG. 1). The LDPC decoder 112 may obtain the syndrome vector by performing matrix multiplication on a parity-check matrix and the codeword. The syndrome vector may indicate whether the codeword is correct.

The LDPC decoder 112 determines whether the syndrome vector is a zero vector in operation S720. When all elements of the syndrome vector are 0, the LDPC decoder 112 may determine that the codeword is correct and may terminate the operation. When at least one element of the syndrome vector is 1, the LDPC decoder 112 may determine that the codeword includes an error bit.

In operation S730, the LDPC decoder 112 performs sequential column decoding in an operation mode varying with each column. The LDPC decoder 112 may perform sequential column decoding with respect to each column in one of the first to third operation modes. The LDPC decoder 112 may determine an operation mode for each column, based on the column degree and error level of the column.

The LDPC decoder 112 iteratively performs the sequential column decoding until the syndrome vector is a zero vector, in operation S740. Whenever the sequential column decoding is completed in operation S730, at least one error bit in the codeword may be corrected. Whenever completing the sequential column decoding, the LDPC decoder 112 may perform matrix multiplication on the parity-check matrix and the codeword and determine whether the syndrome vector is a zero vector. When the syndrome vector is not a zero vector, the LDPC decoder 112 may correct error bits by iteratively performing the sequential column decoding.

Figure 8:
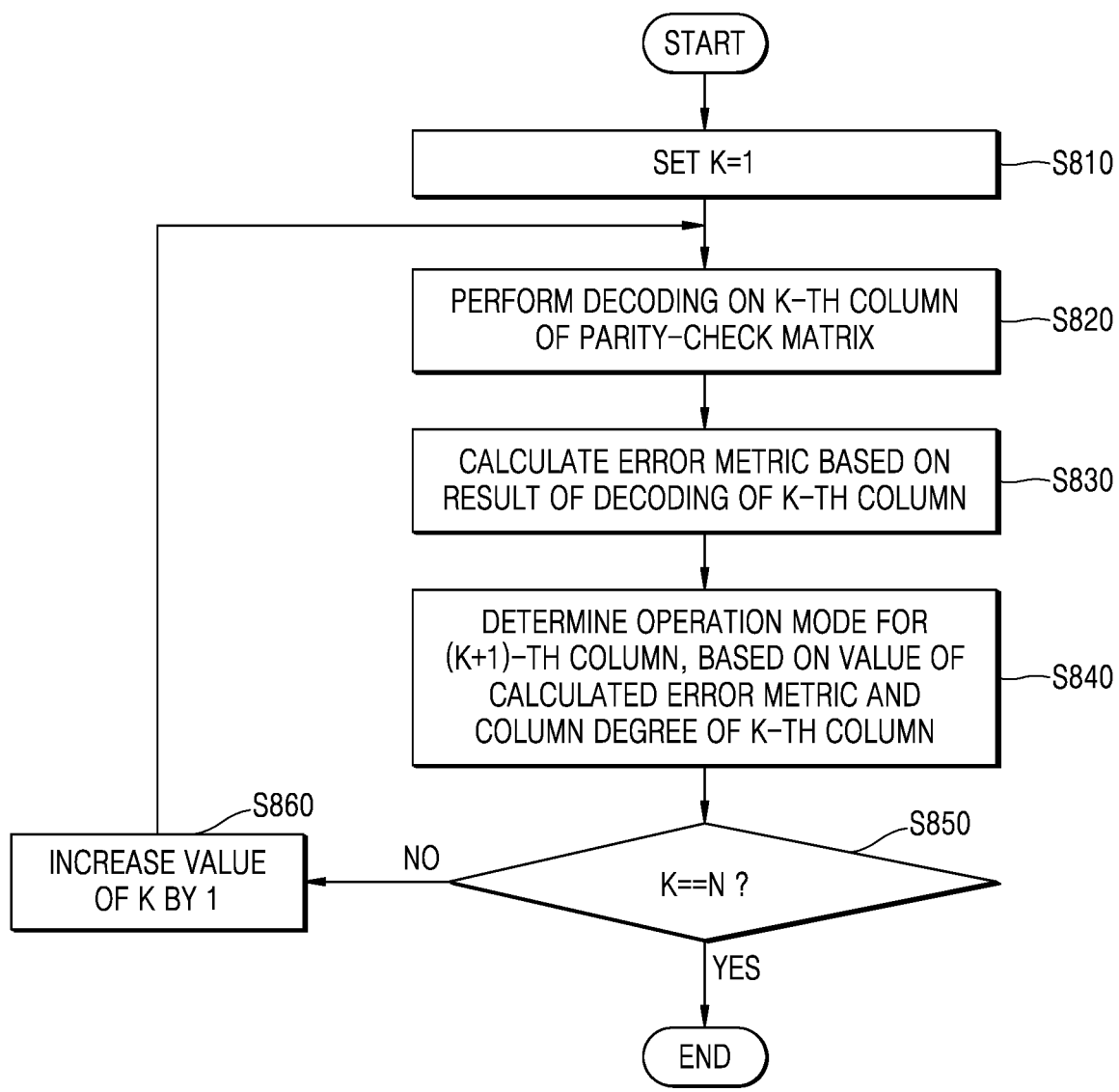
FIG. 8 is a detailed flowchart of sequential column decoding according to an implementation.

FIG. 8 is a detailed flowchart of sequential column decoding according to an implementation.

Referring to FIG. 8, the LDPC decoder 112 sets K to 1 in operation S810. Here, K may indicate a column to be decoded.

The LDPC decoder 112 performs decoding on a K-th column of a parity-check matrix in operation S820. Because K is set to 1 in operation S810, the LDPC decoder 112 may perform decoding on the first column of the parity-check matrix. Before an operation mode for the K-th column is determined in operation S840 described below, the decoding of the K-th column may be performed. Accordingly, when the LDPC decoder 112 initially performs sequential column decoding (i.e., at the initial time point), the LDPC decoder 112 may perform decoding of the K-th column in a default operation mode. The default operation mode may be the first operation mode for ultra-low-power decoding, the second operation mode for low-power decoding, or the third operation mode for normal decoding.

The LDPC decoder 112 calculates an error metric based on a result of the decoding of the K-th column, in operation S830. The error metric may represent an error level of the codeword and may include a CSW and an SW. For example, the LDPC decoder 112 may complete the decoding of the K-th column by using the CSW calculation circuit 521 and then may calculate a CSW metric that is the sum of non-zero check nodes among all check nodes of the parity-check matrix. For example, the LDPC decoder 112 may calculate a syndrome vector by performing matrix multiplication on the parity-check matrix and a codeword resulting from the decoding of the K-th column and then may calculate an SW metric by counting the number of 1s among the elements of the syndrome vector.

Figure 3B:
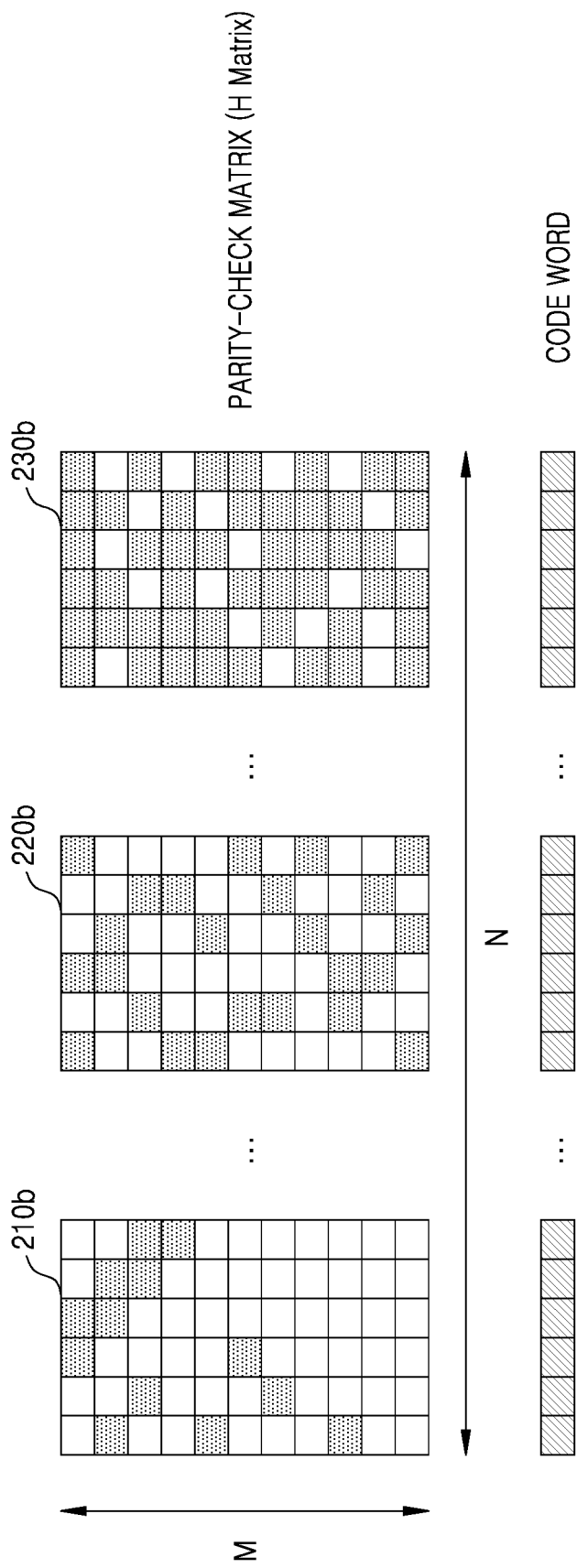
FIG. 3B illustrates another example of a parity-check matrix according to an implementation.

The LDPC decoder 112 determines an operation mode for a (K+1)-th column, based on the value of the calculated error metric and the column degree of the K-th column, in operation S840. The operation mode determination circuit 530 may determine whether the column degree is high or low, based on the column degree (or variable node degree) of the K-th column. The operation mode determination circuit 530 may determine whether the error level of the K-th column is high, middle, or low, based on the error metric calculated with respect to the K-th column. Thereafter, the operation mode determination circuit 530 may determine an operation mode for the (K+1)-th column according to one of the tables of FIGS. 6A to 6D, based on the error level and column degree of the K-th column. Referring to FIGS. 3A and 3B, neighboring columns are highly likely to have the same column degree. For example, the columns in the first area 210 in FIG. 3A may have high column degrees. Accordingly, the operation mode determination circuit 530 may determine an operation mode for the (K+1)-th column, based on the error level and column degree of the K-th column. For example, when the column degree of the K-th column is high and the error level of the K-th column is middle, the operation mode determination circuit 530 may determine the second operation mode for the (K+1)-th column according to the table of FIG. 6B or the first operation mode for the (K+1)-th column according to the table of FIG. 6C.

The LDPC decoder 112 determines whether K is equal to N, in operation S850. In other words, because N columns of the parity-check matrix are sequentially decoded, the LDPC decoder 112 may determine that one iteration is completed when K is equal to N. When K is not equal to N, the LDPC decoder 112 increases the value of K by 1 in operation S860. The value of K may be increased by 1 because sequential decoding of N columns has not been completed when K is not equal to N. Thereafter, the LDPC decoder 112 may repeat operations S820 to S850 until K is equal to N.

Figure 9:
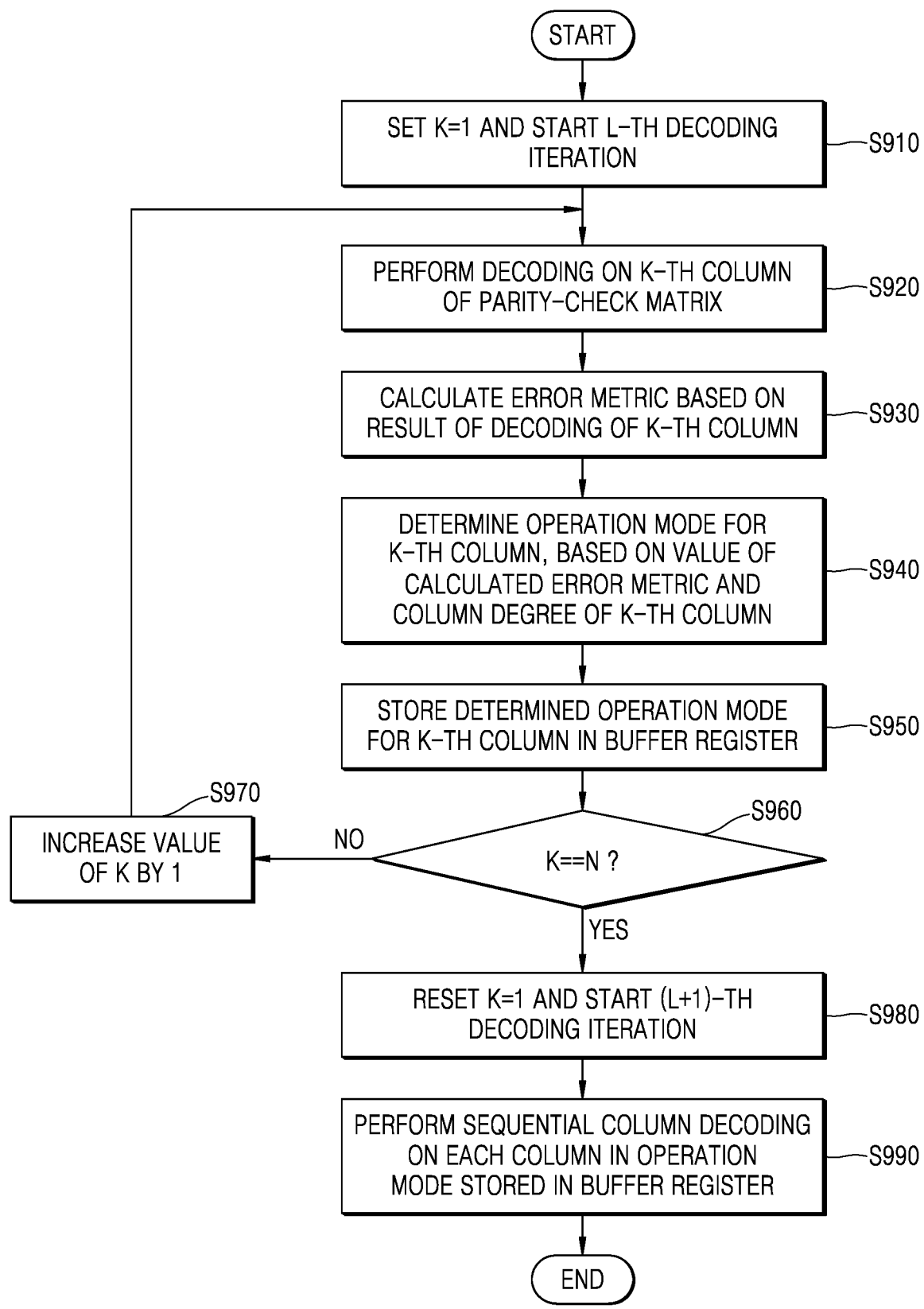
FIG. 9 is a detailed flowchart of sequential column decoding according to an implementation.

FIG. 9 is a detailed flowchart of sequential column decoding according to an implementation.

Referring to FIG. 9, the LDPC decoder 112 sets K to 1 and perform an L-th decoding iteration in operation S910. A decoding iteration may correspond to one iteration. At the initial ECC decoding, L may be 1.

The LDPC decoder 112 performs decoding on a K-th column of a parity-check matrix in operation S920. Because K is set to 1 in operation S910, the LDPC decoder 112 may perform decoding on the first column of the parity-check matrix. Before an operation mode for the K-th column is determined in operation S940 described below, the decoding of the K-th column may be performed. Accordingly, when the LDPC decoder 112 initially performs sequential column decoding (i.e., at the initial time point), the LDPC decoder 112 may perform decoding of the K-th column in a default operation mode. The default operation mode may be the first operation mode for ultra-low-power decoding, the second operation mode for low-power decoding, or the third operation mode for normal decoding. In some implementations, when a syndrome vector resulting from matrix multiplication between a received codeword and the parity-check matrix is not a zero vector, the LDPC decoder 112 may determine the default operation mode according to the number of non-zero elements among the elements of the syndrome vector.

The LDPC decoder 112 calculates an error metric based on a result of the decoding of the K-th column, in operation S930. The error metric may represent an error level of the codeword and may include a CSW and an SW. For example, the LDPC decoder 112 may complete the decoding of the K-th column by using the CSW calculation circuit 521 and then may calculate a CSW metric that is the sum of non-zero check nodes among all check nodes of the parity-check matrix. For example, the LDPC decoder 112 may calculate a syndrome vector by performing matrix multiplication on the parity-check matrix and a codeword resulting from the decoding of the K-th column and then may calculate an SW metric by counting the number of 1s among the elements of the syndrome vector.

The LDPC decoder 112 determines an operation mode for the K-th column, based on the value of the calculated error metric and the column degree of the K-th column, in operation S940. The operation mode determination circuit 530 may determine whether the column degree is high or low, based on the column degree (or variable node degree) of the K-th column. The operation mode determination circuit 530 may determine whether the error level of the K-th column is high, middle, or low, based on the error metric calculated with respect to the K-th column. Thereafter, the operation mode determination circuit 530 may determine an operation mode for the K-th column according to one of the tables of FIGS. 6A to 6D, based on the error level and column degree of the K-th column. For example, when the column degree of the K-th column is high and the error level of the K-th column is middle, the operation mode determination circuit 530 may determine the second operation mode for the K-th column according to the table of FIG. 6B or the first operation mode for the K-th column according to the table of FIG. 6C.

The LDPC decoder 112 stores the determined operation mode for the K-th column in the buffer register 540 in operation S950. In other words, the LDPC decoder 112 may store the operation mode for the K-th column in the buffer register 540 and may perform decoding on the K-th column in the stored operation mode in a subsequent decoding iteration.

The LDPC decoder 112 determines whether K is equal to N, in operation S960. In other words, because N columns of the parity-check matrix are sequentially decoded, the LDPC decoder 112 may determine that one iteration is completed when K is equal to N. In other words, when K is equal to N, the LDPC decoder 112 determines that the L-th decoding iteration is completed in operation S960 and resets K to 1 and performs an (L+1)-th decoding iteration in operation S980. When K is not equal to N, the LDPC decoder 112 increases the value of K by 1 in operation S970. The value of K may be increased by 1 because sequential decoding of N columns has not been completed when K is not equal to N. Thereafter, the LDPC decoder 112 may repeat operations S920 to S960 until K is equal to N.

The LDPC decoder 112 performs sequential decoding on each column of the parity-check matrix, based on the operation mode stored in the buffer register 540 for the column, in operation S990. For example, the first operation mode may have been determined for the K-th column in operations S920 to S950. Because the buffer register 540 stores the first operation mod for the K-th column, the LDPC decoder 112 may perform decoding on the K-th column in the first operation mode stored in the buffer register 540. In other words, during the L-th decoding iteration, an operation mode for each column of a parity-check matrix may be determined based on the column degree and error level of the column. During the (L+1)-th decoding iteration, sequential column decoding may be performed on each column of the parity-check matrix in the operation mode stored in the buffer register 540.

Figure 10:
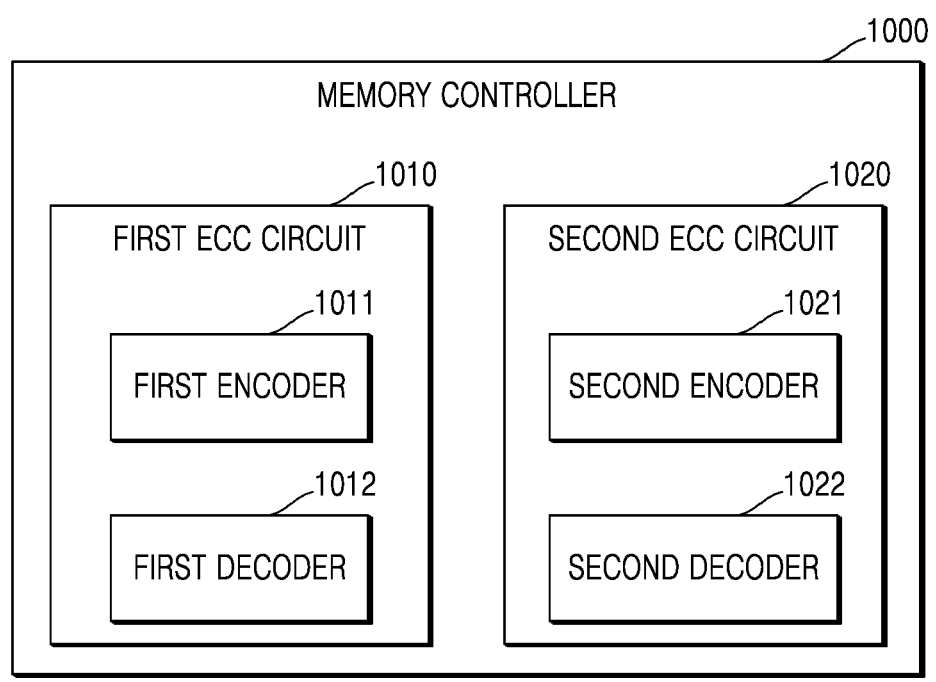
FIG. 10 is a block diagram of a memory controller according to an implementation.

FIG. 10 is a block diagram of a memory controller 1000 according to an implementation.

Referring to FIG. 10, the memory controller 1000 performs concatenated encoding and concatenated decoding. For example, the memory controller 1000 includes a first ECC circuit 1010 and a second ECC circuit 1020. The first ECC circuit 1010 includes a first encoder 1011 and a first decoder 1012. The second ECC circuit 1020 includes a second encoder 1021 and a second decoder 1022.

In some implementations, the memory controller 1000 may receive write data from a host and may perform concatenated encoding by performing primary encoding by using the first encoder 1011 and performing secondary encoding on a result of the primary encoding by using the second encoder 1021. The memory controller 1000 may receive read data from a memory device (e.g., the memory device 200 in FIG. 1) and may perform concatenated decoding by performing primary decoding by using the first decoder 1012 and performing secondary decoding on a result of the primary decoding by using the second decoder 1022.

In some implementations, at least one of the first ECC circuit 1010 and the second ECC circuit 1020 may be based on a LDPC code. For example, the first ECC circuit 1010 may be based on an LDPC code and the second ECC circuit 1020 may be based on at least one selected from the group consisting of a Bose-Chaudhuri-Hocquenghem (BCH) code, a Reed-Solomon (RS) code, and a polar code. For example, the first ECC circuit 1010 and the second ECC circuit 1020 may be based on the same LDPC code. When both the first ECC circuit 1010 and the second ECC circuit 1020 are based on an LDPC code, the memory controller 1000 may further include an interleaver. The interleaver may perform interleaving on an encoded codeword of the first ECC circuit 1010 and provide a result of the interleaving to the second ECC circuit 1020, thereby increasing an error correction capability.

Figure 11:
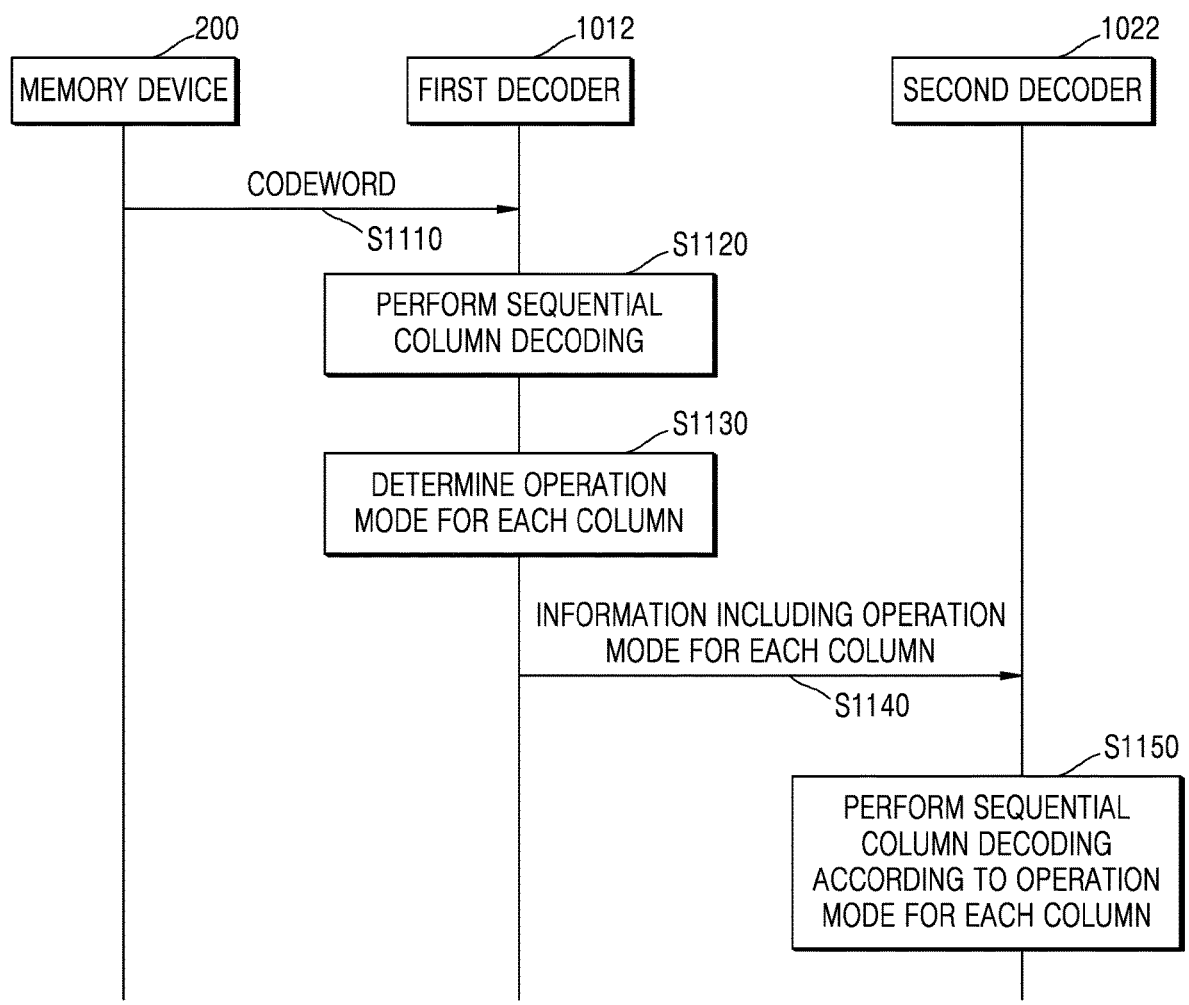
FIG. 11 illustrates a signal flow in a memory controller according to an implementation.

FIG. 11 illustrates a signal flow in the memory controller 1000 according to an implementation.

Referring to FIG. 11, the first decoder 1012 receives a codeword from the memory device 200 in operation S1110. The codeword may result from concatenated encoding of the first ECC circuit 1010 and the second ECC circuit 1020 in FIG. 10.

The first decoder 1012 performs sequential column decoding in operation S1120 and determines an operation mode for each column in operation S1130. The sequential column decoding and the determining of an operation mode for each column, which are performed by the first decoder 1012, may correspond to operations S810 to S850 in FIG. 8.

The first decoder 1012 provides the second decoder 1022 with information including an operation mode for each column, in operation S1140. In other words, because the second decoder 1022 and the first decoder 1012 are based on the same parity-check matrix, the second decoder 1022 may refer to information about an operation mode for each column, which has been obtained by the first decoder 1012, when performing a decoding iteration.

The second decoder 1022 performs sequential column decoding, based on the information including an operation mode for each column, in operation S1150, wherein the information is received from the first decoder 1012.

Although it is illustrated that the first decoder 1012 provides the second decoder 1022 with information about an operation mode for each column, implementations are not limited thereto. In some implementations, the first decoder 1012 may provide the second decoder 1022 with intermediate decoding result data. At this time, the size of the intermediate decoding result data provided to the second decoder 1022 may be 1 bit to 3 bits according to the operation mode determined by the first decoder 1012 for each column.

While this specification contains many specific implementation details, these should not be construed as limitations on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

While the scope of the technology described herein has been particularly shown and described with reference to implementations thereof, it will be understood that various changes in form and details may be made therein without departing from the spirit and scope of the following claims.

What is claimed is:

1. An operating method of an error correction code (ECC) circuit, the operating method comprising:
   receiving, by the ECC circuit, a codeword from a memory device, wherein the codeword corresponds to data read from the memory device in response to receiving a read request from a host;
   calculating, by the ECC circuit, a syndrome vector based on the codeword and a parity-check matrix, the parity-check matrix including information indicating that a plurality of messages are exchanged between a plurality of check nodes and a plurality of variable nodes;
   performing, by the ECC circuit and based on the syndrome vector being not a zero vector, sequential decoding on a plurality of columns of the parity-check matrix by variably setting an operation mode for decoding each column of the plurality of columns, wherein the operation mode is set from a plurality of operation mode including a first operation mode, a second operation mode, and a third operation mode, and performing the sequential decoding on the plurality of columns comprises
      decoding, by the ECC circuit, a first column in the first operation mode, the first column having a first variable node degree among the plurality of columns,
      decoding, by the ECC circuit, a second column in the second operation mode, the second column having a second variable node degree among the plurality of columns, and
      decoding, by the ECC circuit, a third column in the third operation mode, the third column having a third variable node degree among the plurality of columns;
   calculating, by the ECC circuit, the syndrome vector based on the sequential decoding on the plurality of columns being completed;
   iteratively performing, by the ECC circuit, the sequential decoding until the syndrome vector is the zero vector to obtain decoded data; and
   transmitting, by the ECC circuit, the decoded data to the host.

2. The operating method of claim 1, wherein performing the sequential decoding on the plurality of columns comprises:
   calculating an error metric corresponding to each column of the first column, the second column, and the third column based on a result of decoding of each column of the first column, the second column, and the third column; and
   determining the first operation mode for the first column, the second operation mode for the second column, and the third operation mode for the third column based on the first variable node degree, the second variable node degree, the third variable node degree, and error metrics respectively corresponding to the first column, the second column, and the third column.

3. The operating method of claim 2, wherein the error metric corresponds to at least one of a checksum weight (CSW) or a syndrome weight (SW), the CSW indicating a number of non-zero check nodes as a result of column decoding, and the SW indicating a number of 1s in the syndrome vector.

4. The operating method of claim 3, wherein
   a magnitude of a first error metric corresponding to the first column is less than a first metric threshold value,
   a magnitude of the first variable node degree corresponding to the first column is greater than a degree threshold value, and
   the first operation mode sets a size of each message of the plurality of messages to 1 bit for ultra-low-power decoding, the plurality of messages being exchanged between the plurality of variable nodes and the plurality of check nodes.

5. The operating method of claim 3, wherein
   a magnitude of a second error metric corresponding to the second column is greater than a first metric threshold value and less than a second metric threshold value,
   a magnitude of the second variable node degree corresponding to the second column is greater than a degree threshold value, and
   the second operation mode sets a size of each message of the plurality of messages to 2 bits for low-power decoding, the plurality of messages being exchanged between the plurality of variable nodes and the plurality of check nodes.

6. The operating method of claim 3, wherein
   a magnitude of a third error metric corresponding to the third column is greater than a first metric threshold value and a second metric threshold value,
   a magnitude of the third variable node degree corresponding to the third column is less than a degree threshold value, and
   the third operation mode sets a size of each message of the plurality of messages to 3 bits for normal decoding, the plurality of messages being exchanged between the plurality of variable nodes and the plurality of check nodes.

7. The operating method of claim 1, wherein in the first operation mode, a first size of each message of the plurality of messages is set to 1 bit, in the second operation mode, a second size of each message of the plurality of messages is set to 2 bits, and in the third operation mode, a third size of each message of the plurality of messages is set to 3 bits.

8. The operating method of claim 1, comprising performing decoding on a subsequent column in the first operation mode, the subsequent column being adjacent to the first column.

9. An error correction code (ECC) circuit comprising:
   a low-density parity-check (LDPC) encoder configured to encode write data received from a host; and
   an LDPC decoder configured to
      receive a codeword from a memory device, wherein the codeword corresponds to data read from the memory device in response to receiving a read request from the host,
      calculate a syndrome vector based on the codeword and a parity-check matrix, the parity-check matrix including information indicating that a plurality of messages are exchanged between a plurality of check nodes and a plurality of variable nodes,
      perform, based on the syndrome vector being not a zero vector, sequential decoding on a plurality of columns of the parity-check matrix by variably setting an operation mode for decoding each column of the plurality of columns, wherein the operation mode is set from a plurality of operation mode including a first operation mode, a second operation mode, and a third operation mode, and performing the sequential decoding on the plurality of columns comprises decoding a first column in the first operation mode, decoding a second column in the second operation mode, and decoding a third column in the third operation mode, calculate the syndrome vector based on the sequential decoding of the plurality of columns being completed, iteratively perform the sequential decoding until the syndrome vector is the zero vector to obtain decoded data; and transmit the decoded data to the host.

10. The ECC circuit of claim 9, wherein the LDPC decoder is configured to calculate an error metric corresponding to each column of the first column, the second column, and the third column based on a result of decoding of each column of the first column, the second column, and the third column, and determine the first operation mode for the first column, the second operation mode for the second column, and the third operation mode for the third column based on a first variable node degree, a second variable node degree, a third variable node degree, and error metrics respectively corresponding to the first column, the second column, and the third column.

11. The ECC circuit of claim 10, wherein the error metric corresponds to at least one of a checksum weight (CSW) or a syndrome weight (SW), the CSW indicating a number of non-zero check nodes as a result of column decoding, and the SW indicating a number of 1s in the syndrome vector.

12. The ECC circuit of claim 11, wherein a magnitude of a first error metric corresponding to the first column is less than a first metric threshold value, a magnitude of the first variable node degree corresponding to the first column is greater than a degree threshold value, and the first operation mode sets a size of each message of the plurality of messages to 1 bit for ultra-low-power decoding, the plurality of messages being exchanged between the plurality of variable nodes and the plurality of check nodes.

13. The ECC circuit of claim 11, wherein a magnitude of a second error metric corresponding to the second column is greater than a first metric threshold value and less than a second metric threshold value, a magnitude of the second variable node degree corresponding to the second column is greater than a degree threshold value, and the second operation mode sets a size of each message of the plurality of messages to 2 bits for low-power decoding, the plurality of messages being exchanged between the plurality of variable nodes and the plurality of check nodes.

14. The ECC circuit of claim 11, wherein a magnitude of a third error metric corresponding to the third column is greater than a first metric threshold value and a second metric threshold value, a magnitude of the third variable node degree corresponding to the third column is less than a degree threshold value, and the third operation mode sets a size of each message of the plurality of messages to 3 bits for normal decoding, the plurality of messages being exchanged between the plurality of variable nodes and the plurality of check nodes.

15. The ECC circuit of claim 9, wherein the parity-check matrix is based on an irregular LDPC code.

16. The ECC circuit of claim 9, wherein the LDPC decoder is configured to perform decoding on a subsequent column in the first operation mode, the subsequent column being adjacent to the first column.

17. An operating method of an error correction code (ECC) circuit, the operating method comprising:

receiving, by the ECC circuit, a codeword from a memory device, wherein the codeword corresponds to data read from the memory device in response to receiving a read request from a host;

obtaining, by the ECC circuit, an error metric with respect to each column of a plurality of columns of a parity-check matrix by performing a first decoding iteration on the codeword;

determining, by the ECC circuit, one operation mode of a first operation mode, a second operation mode, and a third operation mode to be an operation mode for each column of the plurality of columns based on the error metric obtained in the first decoding iteration and a variable node degree of each column of the plurality of columns;

performing, by the ECC circuit, a second decoding iteration according to the operation mode determined for each column of the plurality of columns to obtain decoded data; and transmitting, by the ECC circuit, the decoded data to the host.

18. The operating method of claim 17, wherein the first operation mode sets a first size of each message of a plurality of messages to 1 bit for ultra-low-power decoding, the plurality of messages being exchanged between a plurality of variable nodes and a plurality of check nodes of the parity-check matrix, the second operation mode sets a second size of each message of the plurality of messages to 2 bits for low-power decoding, the plurality of messages being exchanged between the plurality of variable nodes and the plurality of check nodes, and the third operation mode sets a third size of each message of the plurality of messages to 3 bits for normal decoding, the plurality of messages being exchanged between the plurality of variable nodes and the plurality of check nodes.

19. The operating method of claim 17, wherein the error metric corresponds to at least one of a checksum weight (CSW) or a syndrome weight (SW), the CSW indicating a number of non-zero check nodes as a result of column decoding, and the SW indicating a number of 1s in a syndrome vector.

20. The operating method of claim 17, wherein the parity-check matrix is based on an irregular low-density parity-check (LDPC) code.

* * * * *